United States Patent [19]

Kanai et al.

[11] Patent Number: 5,144,158
[45] Date of Patent: Sep. 1, 1992

[54] ECL LATCH CIRCUIT HAVING A NOISE RESISTANCE CIRCUIT IN ONLY ONE FEEDBACK PATH

[75] Inventors: Yasunori Kanai, Inagi; Kazumasa Nawata; Mitsuhisa Shimizu, both of Kawasaki; Hiroki Yada; Taichi Saitoh, both of Yokohama; Toshiaki Sakai, Kuwana, all of Japan

[73] Assignee: Fujitsu Limited, Kawasaki, Japan

[21] Appl. No.: 511,958

[22] Filed: Apr. 17, 1990

Related U.S. Application Data

[63] Continuation of Ser. No. 412,624, Sep. 28, 1989, abandoned, which is a continuation of Ser. No. 188,667, Apr. 29, 1988, abandoned, which is a continuation of Ser. No. 94,078, Sep. 8, 1987, abandoned, which is a continuation of Ser. No. 798,294, Nov. 15, 1985, abandoned.

[30] Foreign Application Priority Data

Nov. 19, 1984 [JP] Japan .................. 59-242371
Apr. 8, 1985 [JP] Japan .................. 60-074085

[51] Int. Cl.⁵ ............................................. H03K 17/16
[52] U.S. Cl. ................. 307/272.1; 307/455; 307/291; 307/443; 307/520; 307/556
[58] Field of Search ............... 307/443, 200.1, 200.2, 307/291, 455, 520, 556, 272.1, 272.2; 357/14

[56] References Cited

U.S. PATENT DOCUMENTS

| | | | |
|---|---|---|---|
| 3,138,743 | 6/1964 | Kilby | 357/51 |
| 3,786,282 | 1/1974 | Orndorff | 307/200 A |
| 4,398,105 | 8/1983 | Keller | 307/443 |

OTHER PUBLICATIONS 198, 1977 IEEE Int. Solid-State Circuits Conference Session XVI: High Speed Logic.

Primary Examiner—Stanley D. Miller
Assistant Examiner—Margaret Rose Wambach
Attorney, Agent, or Firm—Staas & Halsey

[57] ABSTRACT

A latch circuit including at least three gate circuits, and a noise resistance circuit. A first gate circuit (3, 4, 11, 16) receives a data signal (DT) and a clock signal (CLK). A second gate circuit (1, 7, 13, 17) is connected to an output of the first gate circuit. A third gate circuit (2, 5, 12 18) receives a first inverted clock signal ($\overline{CLK}$) at an input terminal. A second input terminal of the third gate circuit is connected to an output of the second gate circuit and is a first output terminal is connected to an input terminal of the second gate circuit, so that a feedback line is formed between the second and third gate circuits. The noise resistance circuit (8, 9, 20, 21) has at least a signal delay element in the feedback line. The noise resistance circuit may include a filter circuit. The noise resistance circuit may also include an amplifier circuit.

16 Claims, 9 Drawing Sheets

Fig. 1   PRIOR ART
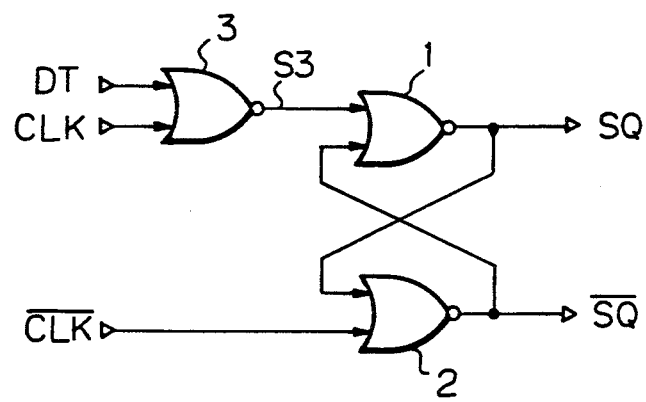
PRIOR ART
Fig. 2a  CLK  
Fig. 2b  $\overline{CLK}$  
Fig. 2c  DT  
Fig. 2d  S3  
Fig. 2e  SQ  
Fig. 2f  $\overline{SQ}$  

ECL LATCH CIRCUIT HAVING A NOISE RESISTANCE CIRCUIT IN ONLY ONE FEEDBACK PATH

This is a continuation of copending application Ser. No. 07/412,624 filed on Sept. 26, 1989, which is a continuation of Ser. No. 07/188,667 filed Apr. 29, 1988, which is a continuation of Ser. No. 07/094,078 filed Sept. 8, 1987, which is a continuation of Ser. No. 06/798,294, filed Nov. 15, 1985, now abandoned.

BACKGROUND OF THE INVENTION

1. Field of the Invention

The present invention relates to a semiconductor integrated circuit. More particularly, it relates to latch terminal. A second input terminal of the third gate circuit each having a circuit for soft-error noise resistance.

2. Description of the Related Art

In charge-coupled-device (CCD) memories and dynamic metal oxide semiconductor (MOS) random access memories (RAMs), a soft-error due to alpha-rays is extensively known. A package for a semiconductor device includes very small amounts of uranium (U) and thorium (Th) which decay and emit alpha-rays. The emitted alpha-rays impinge on a semiconductor chip including integrated circuits and generate a plurality of pairs of electrons and positive-holes, particularly in area in which capacitors or depletion regions are formed. The electrons are gathered in an active region, such as a collector region of a transistor, resulting in the reduction of potential at the collector. This reduction of potential occurs in a very short time-period, for example, several hundreds of picoseconds, but may adversely affect the integrated circuit in the semiconductor chip.

In principle, the above-mentioned soft-error may occur in any semiconductor device. In dynamic MOS RAMs, for example, to overcome the soft-error, counter-measures are taken such as the provision of error-collection circuits (ECCs), alpha-ray shield sheets, etc.

In bipolar semiconductor devices or static MOS RAMs, the above soft-error has not had a serious effect, because they have high operating stability and large amplitudes. Recently, however, the integration of semiconductor devices has greatly increased, resulting in smaller amplitudes and smaller operating currents. As a result, even in bipolar semiconductor devices, including, for example, emitter-coupled logic (ECL) circuits and transistor-transistor-logic (TTL) circuits, the effects of soft-error must be taken into account.

Latch circuits are extensively used in semiconductor devices. For example, in a gate array semiconductor device, latch circuits are used for holding input or output data or temporary inner data storage, or the like. In a memory device, latch circuits are used for holding control data, or the like. If latch circuits are affected by a soft-error, the held data may be destroyed, causing troublesome problems such as error signal output. Therefore, latch circuits of the bipolar type or other type must be free from alpha-rays.

Known circuits for overcoming soft-errors, however, cannot be applied to latch circuits, because latch circuits must maintain high speed response and must have a simple structure.

SUMMARY OF THE INVENTION

It is an object of the present invention to provide a latch circuit having a noise resistance and maintaining a high speed response.

It is another object of the present invention to provide a latch circuit having a noise resistance circuit formed by a simple structure.

It is still another object of the present invention to provide a latch circuit realizing the above objects in a semiconductor device.

According to the present invention, there is provided a latch circuit including at least three gate circuits, a first gate circuit receiving a data signal and a clock signal, a second gate circuit operatively connected to an output of the first gate circuit, and a third gate circuit receiving an inverted clock signal at one input terminal, operatively connected to an output of the second gate circuit at another input terminal and operatively connected to another input terminal of the second gate circuit at an output terminal, so that a feedback line is formed between the second and third gate circuits, and a noise resistance circuit having at least a signal delay element in the feedback line.

The noise resistance circuit may include a filter circuit. The filter circuit may be a resistor-capacitor connected filter. The noise resistance circuit may include an amplifier circuit having a signal delaying element having a predetermined delay time and a signal amplifying element having a predetermined amplification factor. The amplifier circuit may include a differential amplifier formed by transistors.

BRIEF DESCRIPTION OF THE DRAWINGS

Other objects and features of the present invention will be described below in detail with reference to the accompanying drawings, in which:

FIG. 1 is a block diagram of a latch circuit of the prior art;

FIGS. 2a to 2f are timing charts of the latch circuit shown in FIG. 1;

DESCRIPTION OF THE PREFERRED EMBODIMENTS

Before describing preferred embodiments of the present invention, an explanation will be given of the prior art.

Referring to FIG. 1, a conventional latch circuit includes three NOR gate circuits 1 to 3. Each output of the NOR gate circuits 1 and 2 is fed back to an input of the other NOR gate circuits. The NOR gate circuit 3 receives an input data DT and a clock pulse CLK and an output thereof is connected to another input of the NOR gate circuit 1. An inverted clock pulse $\overline{CLK}$ is supplied to another input of the NOR gate circuit 2.

Referring to FIGS. 2a to 2f, the operation of the latch circuit in FIG. 1 will be described. When the input data DT is a low level at the time the clock pulse CLK is changed to a low level, a signal S3 at the output of the NOR gate circuit 3 becomes a high level. At this time, if an output signal SQ of the NOR gate circuit 1 is a high level as an initial condition, the output signal SQ is changed to a low level. Accordingly, at the time the inverted clock pulse $\overline{CLK}$ is changed from high level to low level, two inputs at the NOR gate circuit 2 are both a low level, with the result that an output signal $\overline{SQ}$ of the NOR gate circuit 2 is changed to a high level. If one input of the NOR gate circuit 3 is maintained at a high level, and after the output signal S3 of the NOR gate circuit 3 changes from a high level to a low level, the output signal SQ of the NOR gate circuit 1 is maintained at a low level.

When the input data DT is a high level at the time the clock pulse CLK is changed from a high level to a low level, the output signal S3 of the NOR gate circuit 3 is maintained at a low level. When the inverted clock pulse $\overline{CLK}$ is changed from a low level to a high level, the output signal $\overline{SQ}$ of the NOR gate circuit 2 is rendered a low level, thus changing the output signal SQ of the NOR gate circuit 1 to a high level. After the inverted clock pulse $\overline{CLK}$ is changed from the high level to the low level, the input signal at the NOR gate circuit 2 is kept at the high level by applying the high level output signal SQ, and thus the output signal $\overline{SQ}$ is maintained at the low level.

Figure 3:
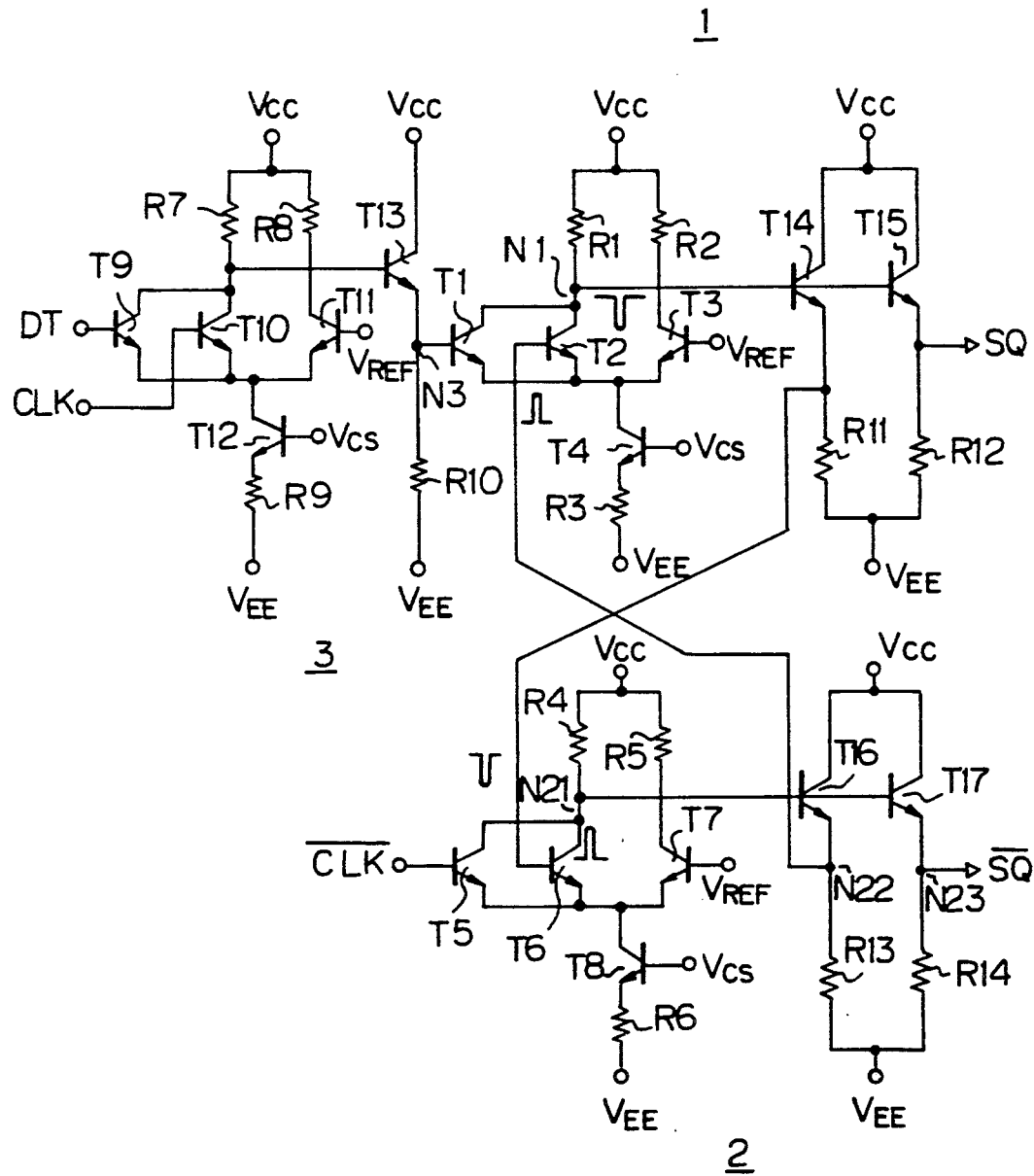
FIG. 3 is a circuit diagram of the latch circuit shown in FIG. 1.

FIG. 3 is an ECL gate circuit diagram of the latch circuit shown in FIG. 1. In FIGS. 1 and 3, the NOR gate circuit 1 is formed by transistors T1, T2, T3, and T4 and cooperative resistors R1, R2, R3. That is, the resistors R1 and R2 and the transistors T1 to T3 form an ECL gate and the series-connected transistor T4 and the resistor R3 form a current source. The NOR gate circuit 2 is formed by transistors T5, T6, T7, and T8 and resistors R4, R5, and R6. That is, the resistors R4 and R5 and the transistors T5 to T7 form an ECL gate and the transistor T8 and the resistor R6 form a current source. The NOR gate circuit 3 is formed by transistors T9, T10, T11, and T12 and resistors R7, R8, and R9. That is, the resistors R7 and R8 and the transistors T9 to T11 form an ECL gate and the transistor T12 and the resistor R9 form a current source. The output of the NOR gate circuit 3 is connected to an input of the NOR gate circuit 1, i.e, to the base of the transistor T1, through an emitter follower circuit formed by a series-connected transistor T13 and a resistor R10. An output of the NOR gate circuit 1 is transmitted as the output signal SQ through an emitter follower circuit formed by a series-connected transistor T15 and a resistor R12. Another output of the NOR gate circuit 1 is supplied to one input of the NOR gate circuit 2, i.e., a base of the transistor T6, through an emitter follower circuit formed by a series-connected transistor T14 and a resistor R11. An output of the NOR gate circuit 2 is extracted as the output signal $\overline{SQ}$ through an emitter follower circuit formed by a series-connected transistor T17 and a resistor R14. Another output of the NOR gate circuit 2 is supplied to another input of the NOR gate circuit 1, i.e., a base of the transistor T2, through an emitter follower circuit formed by a series-connected transistor T16 and a resistor R13.

The NOR gate circuit 3 receives the input data DT at an input terminal, i.e., a base of the transistor T9, and the clock pulse CLK at another input terminal, i.e., a base of the transistor T10. When the input data DT and the clock pulse CLK are a low level, the transistors T9 and T10 are turned OFF, thus making the transistor T11 ON. As a result, the output of the NOR gate circuit 3 connected to a base of the transistor T13 becomes a high level. Conversely, when at least one of the input data DT and the clock pulse CLK is a high level, one of the transistors T9 and T10 is turned ON, thus making the transistor T11 OFF. As a result, the output of the NOR gate circuit 3 is rendered a low level.

The above operation of the NOR gate circuit 3 can be applied to the NOR gate circuits 1 and 2 in a similar way. Accordingly, the circuit shown in FIG. 3 performs a latch operation set forth above with reference to FIGS. 1 and 2a to 2f.

Figure 4:
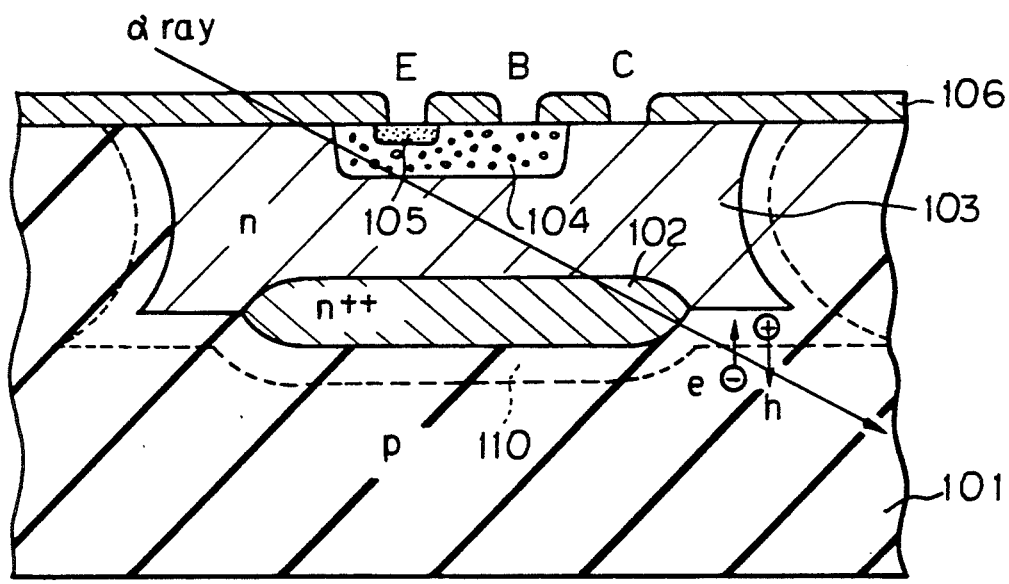
FIG. 4 is a sectional view of a bipolar transistor in the latch circuit shown in FIG. 1, for explaining the occurrence of soft errors.

Referring to FIG. 4, the soft-error in a bipolar transistor, for example, the transistor T2 in FIG. 3, will be described. The transistor is formed by a p-type silicon substrate 101, n++implanted layer 102, n-type epitaxial growth layer 103, a first diffused layer 104, a second diffused layer 105, and an insulation layer 106 of $SiO_2$. An emitter E, a base B, and a collector C are connected to the exterior through contact windows formed in the insulation layer 106. Along a boundary face formed between the substrate 101, the epitaxial growth layer 103, and the implanted layer 102, a depletion layer 110, as shown by dotted lines, is formed as a parasitic capacitor.

The materials used for a package of a semiconductor device may include a small quantity of uranium and/or thoriam, which emit alpha rays. When alpha rays emitted from the package pass through the depletion layer 110, as shown in FIG. 4, a plurality of carriers, each of which consists of a pair of an electron e and a positive hole h pair, may be generated at the depletion layer 110. The electrons e are gathered to an active region, i.e., a collector region in the example, while the positive holes h pair drop to the substrate 101. Alpha ray energy is approximately 5 MeV at average and approximately 9 MeV at maximum. An alpha ray having an energy of 5 MeV will penetrate approximately 30 $\mu$m into silicon, resulting in the generation of approximately $1.4 \times 10^6$ pairs of electrons and positive holes. If $1.4 \times 10^6$ electrons are gathered to the collector region during the period of 0.1 to 1 ns, an approximately 200 $\mu$A pulse current may flow into the collector region. If the gathering time is short, the pulse current may be increased. The charge Q is defined by the product of a capacitance C of the parasite capacitance and a potential V, i.e., $Q = C \cdot V$. By increasing the integration of the semiconductor circuits, the area of each depletion region is reduced and causes a small capacitance. When the charge Q is a constant, the potential V is increased due to reduction of the capacitance C. As a result, even in the bipolar integrated semiconductor device the potential change due to the pulse current caused by alpha rays may result in a malfunction of the transistor.

Referring back to FIG. 3, it is supposed that the high level data of the output signal SQ and the low level data of the output signal $\overline{SQ}$ are held. At this time, the transistors T1 and T2 in the NOR gate circuit 1 are turned OFF, and thus a node N1 is made a high level. The transistor T6 in the NOR gate circuit 2 is turned ON, and thus a node N21 is made a low level. Under this condition, if a negative polarity noise pulse due to alpha rays is supplied to the node N1, the noise pulse is supplied to the base of the transistor T6 through the transistor T14, with the result that the transistor T6 is made OFF for a short period. At this time, a positive polarity noise pulse may be generated at the node N21. The latter noise pulse is fed back to the base of the transistor T2, with the result that the potential at the node N1 is further reduced to low level. As a result, data stored in the latch circuit may be destroyed.

Figure 5:
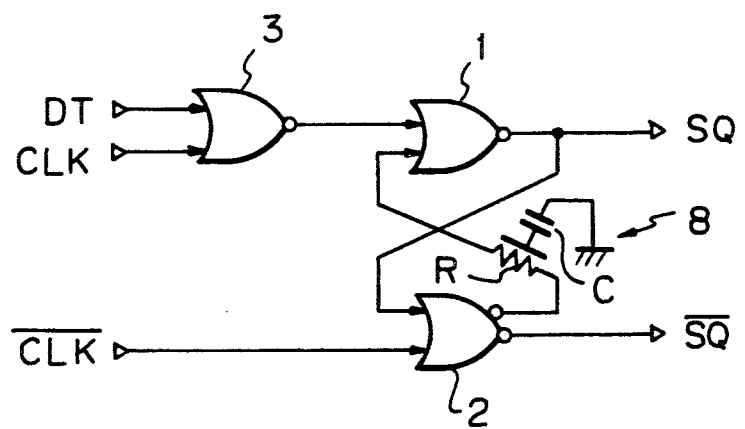
FIG. 5 is a block diagram of a latch circuit of an embodiment according to the present invention.
Figure 6:
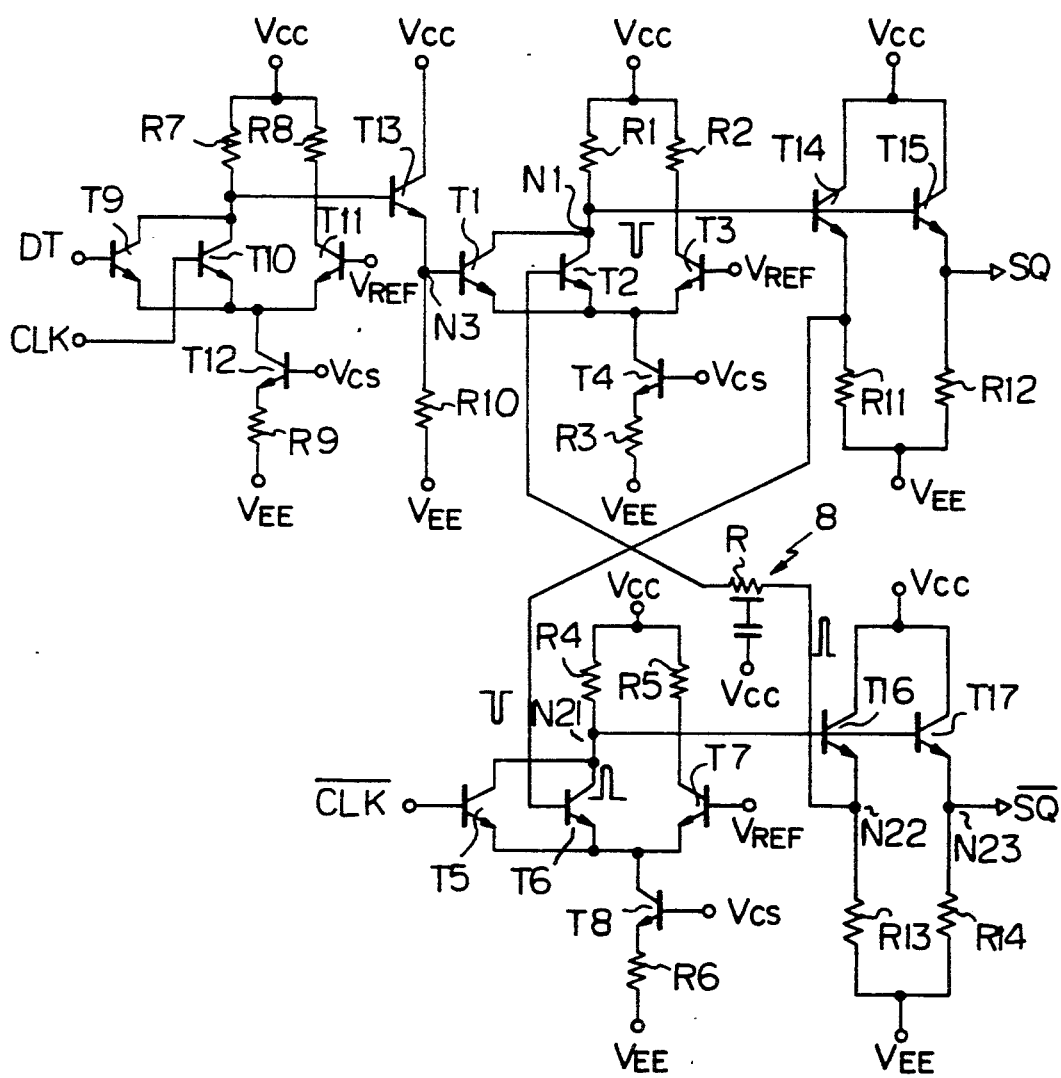
FIG. 6 is a circuit diagram of the latch circuit shown in FIG. 5.

Referring to FIGS. 5 and 6, an embodiment of the present invention will be described.

In FIG. 5, a latch circuit includes a low pass filter (LPF) circuit 8 in addition to NOR gate circuits 1, 2, and 3 which correspond to those in FIG. 1. Preferably, the LPF circuit 8 is provided in a final stage feedback line, i.e., a line between an output of the NOR gate circuit 2 and an input of the NOR gate circuit 1, from the data input side of the NOR gate circuit 3. The input signals DT and CLK at the NOR gate circuit 3 propagate through a path defined by the NOR gate circuit 3, the NOR gate circuit 1, and the NOR gate circuit 2 for outputting the output signals SQ and $\overline{SQ}$ in response to the input data, while the input signals at the NOR gate circuit 2 propagate through another path defined by the NOR gate circuit 2 and the NOR gate circuit 1. The former path has a longer signal transmission length than that of the latter path. If the LPF circuit 8 is provided in another feedback line, i.e., a line between the output of the NOR gate circuit 1 and the input of the NOR gate circuit 2, in the former path, the output signal $\overline{SQ}$ may be delayed due to a time delay of a signal in the LPF circuit 8. On the contrary, when the LPF circuit 8 is provided in the final stage feedback line, as shown in FIG. 5, the response time for outputting the output signals SQ and $\overline{SQ}$ is not affected. This is advantageous for maintaining a high speed operation of the latch circuit.

The LPF circuit 8 consists of a resistor R and a capacitor C and functions as a noise filter for suppressing the above noise.

FIG. 6 is a detailed circuit diagram of the latch circuit shown in FIG. 5. The circuit shown in FIG. 6 corresponds to the circuit shown in FIG. 3, thus the NOR gate circuits 1, 2, and 3 are similar to those shown in FIG. 3. In FIG. 6, the LPF circuit 8 is provided in a feedback line between a node N22 and a base of the transistor T2.

The circuit parameters are as follows:

| | |
|---|---|
| Resistance for the ECL gate resistors R1, R2, R4, R5, R7, and R8: | 2.5 kΩ |
| Resistance for the current source resistors R3, R6, and R9: | 0.75 kΩ |
| Resistance for the emitter-follower circuit resistors | 1 kΩ |

| -continued | |
|---|---|
| R10, R11, R12, R13, and R14: | |
| Voltage of $V_{CC}$: | Ground |
| Voltage of $V_{CS}$: | −2.9 V |
| Voltage of $V_{EE}$: | −5.2 V |
| Voltage of $V_{REF}$: | −1.1 V |
| Voltage of the external signals: | DT, CLK, $\overline{CLK}$ |
| High Level: | −0.85 V |
| Low Level: | −1.35 V |

As can be seen from the above, a current flowing through the ECL gate, for example, the resistor R2 and the transistor T3, is 0.2 mA. a voltage at a collector of the transistor T3 is −0.5 V, may be affected by noise due to alpha-rays. A time constant of the LPF circuit 8 is approximately 200 pico-seconds.

The normal operation of the circuit shown in FIG. 6 is similar to that of the circuit shown in FIG. 3, and thus is omitted.

Under the latch circuit shown in FIG. 6 a high level of the output signal SQ is held, as mentioned above, and if a negative polarity noise pulse due to alpha rays is applied to the node N1, the noise pulse is propagated to the base of the transistor T6 through the transistor T14. The transistor T6 is turned OFF for a short period, generating a short period polarity noise pulse at the node N21. The latter noise pulse may turn the transistors T16 and T17 ON, generating short period polarity pulses at the nodes N22 and N23. The pulse at the node N22 is delayed and suppressed in the LPF circuit 8, and thus, is not supplied to the base of the transistor T2. Accordingly, the data held in the latch circuit is maintained. Upon receipt of the negative polarity noise pulse at the node N1, the output signal SQ may fall, but will be rapidly recovered.

During normal operation, a feedback signal from the node N22 to the base of the transistor T2, which has a longer pulse width than that of the noise pulse, is retarded by a predetermined time defined by a time constant of the LPF circuit 8. This does not substantially effect an adverse response time of the latch circuit, as discussed above with reference to FIG. 5.

In FIG. 6, the NOR gate circuit 2 includes two emitter follower circuits, one of which comprises the transistor T16 and the resistor R13, and the other comprises the transistor T17 and the resistor R14. By separating the output node N23 for the output signal $\overline{SQ}$ from the output node N22 for the feedback signal, the output response time of the output signal $\overline{SQ}$ is kept free from the delay on the feedback line including the LPF circuit 8.

The LPF circuit 8 may be formed in a variety of ways, some examples of which will be described with reference to FIGS. 7 and 8.

Figure 7:
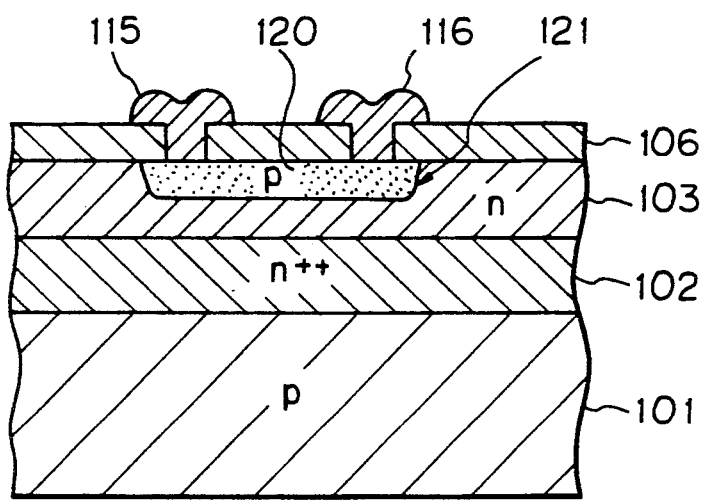
FIGS. 7 and 8 are sectional views of resistors and capacitors in the latch circuit shown in FIG. 6.

In FIG. 7, a resistor region 120 is normally diffused in the epitaxial growth layer 103 and the opposite ends thereof are connected to electrodes 115 and 116 through contact windows formed in the insulation layer 106. A capacitor forming a part of the LPF circuit 8 is formed in a depletion layer 121, which is formed along a face of the resistor region 120 and the epitaxial growth layer 103.

Figure 8:
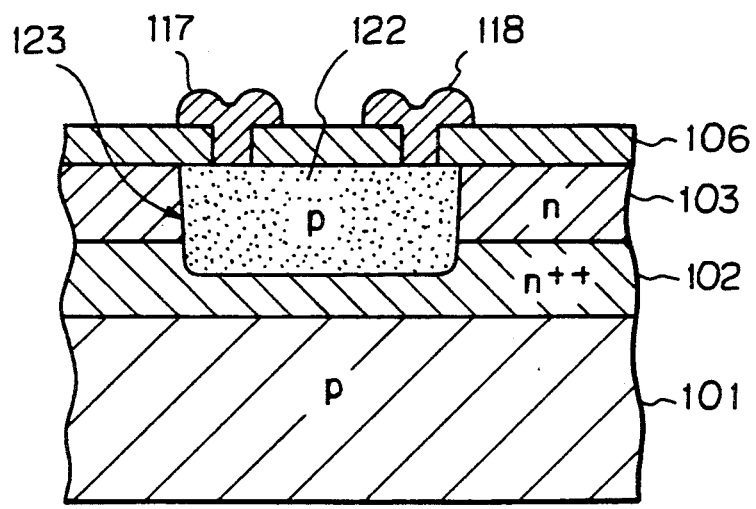

In FIG. 8, a resistor region 122 is formed in the epitaxial growth layer 103 and the implanted layer 102 by an isolation diffusion process. Opposite ends of the resistor region 122 are connected to electrodes 117 and 118 through contact windows formed in the insulation layer 106. A capacitor is formed in a depletion layer 123, which is formed along a face of the resistor region 122 and the epitaxial growth and implanted layers 103 and 102. The capacitor has a greater capacitance than that of FIG. 7.

The resistance of the resistor region 120 or 122 and capacitance of the capacitor in the depletion layer 121 or 123 are suitably designed to eliminate alpha-ray noise. For example, in FIG. 7, the resistance is approximately 2 kΩ and the capacitance is approximately 0.1 pF, thus the time constant is approximately 200 ps, and in FIG. 8, the resistance is approximately 500 Ω and the capacitance 1 pF, thus the time constant is approximately 500 ps.

Figure 9:
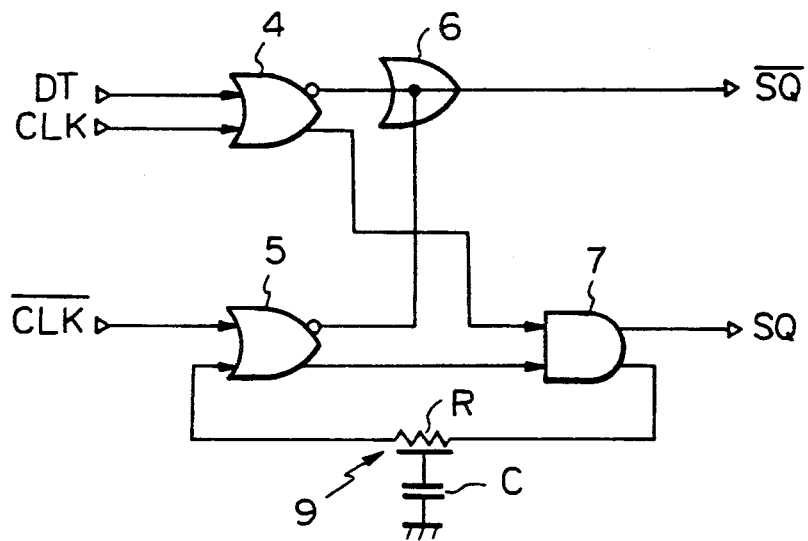
FIG. 9 is a block diagram of a latch circuit of another embodiment according to the present invention.

Referring to FIG. 9, another embodiment of the present invention will be described. In FIG. 9, a latch circuit includes an OR gate circuit 4 receiving the input data DT and the clock pulse CLK and having inverted and non-inverted output terminals, an $\overline{OR}$ gate circuit 5 receiving the inverted clock signal $\overline{CLK}$ and having inverted and non-inverted output terminals, a wired-OR gate circuit 6 outputting the inverted output signal $\overline{SQ}$, and an AND gate circuit 7 outputting the output signal SQ. The non-inverted output terminals of the OR gate circuits 4 and 5 are connected to input terminals of the AND gate circuit 7. The inverted output terminals of the OR gate circuits 4 and 5 are connected to the OR gate circuit 6. A low-pass-filter (LPF) circuit 9 is provided in a feedback line from an output terminal of the AND gate circuit 7 to an input terminal of the OR gate circuit 5.

When the input data DT is a low level, the clock pulse CLK is changed from a high level to a low level, outputting a low level output signal SQ from the AND gate circuit 7. The low level output at the AND gate circuit 7 is fed back to the input of the OR gate circuit 5 through the LPF circuit 9. After the inverted clock pulse $\overline{CLK}$ is changed to a low level, the non-inverted output of the OR gate circuit 5 becomes a low level, maintaining the output of the AND gate circuit 7 at the low level and the inverted output of the OR gate circuit 5 is a high level, thus the output signal $\overline{SQ}$ is maintained at a high level. When the input data DT is a high level, the clock pulse CLK is changed from a high level to a low level, and accordingly, the non-inverted output of the OR gate circuit 4 becomes a high level. At this time, the inverted clock pulse $\overline{CLK}$ is changed from a low level to a high level, with the result that the non-inverted output of the OR gate circuit 5 is made a high level. As a result, the outputs of the AND gate circuit 7 become a high level. The high level output of the AND gate circuit 7 is fed back to the input of the OR gate circuit 5 through the LPF circuit 9, to hold the output signal SQ at the high level.

Figure 10:
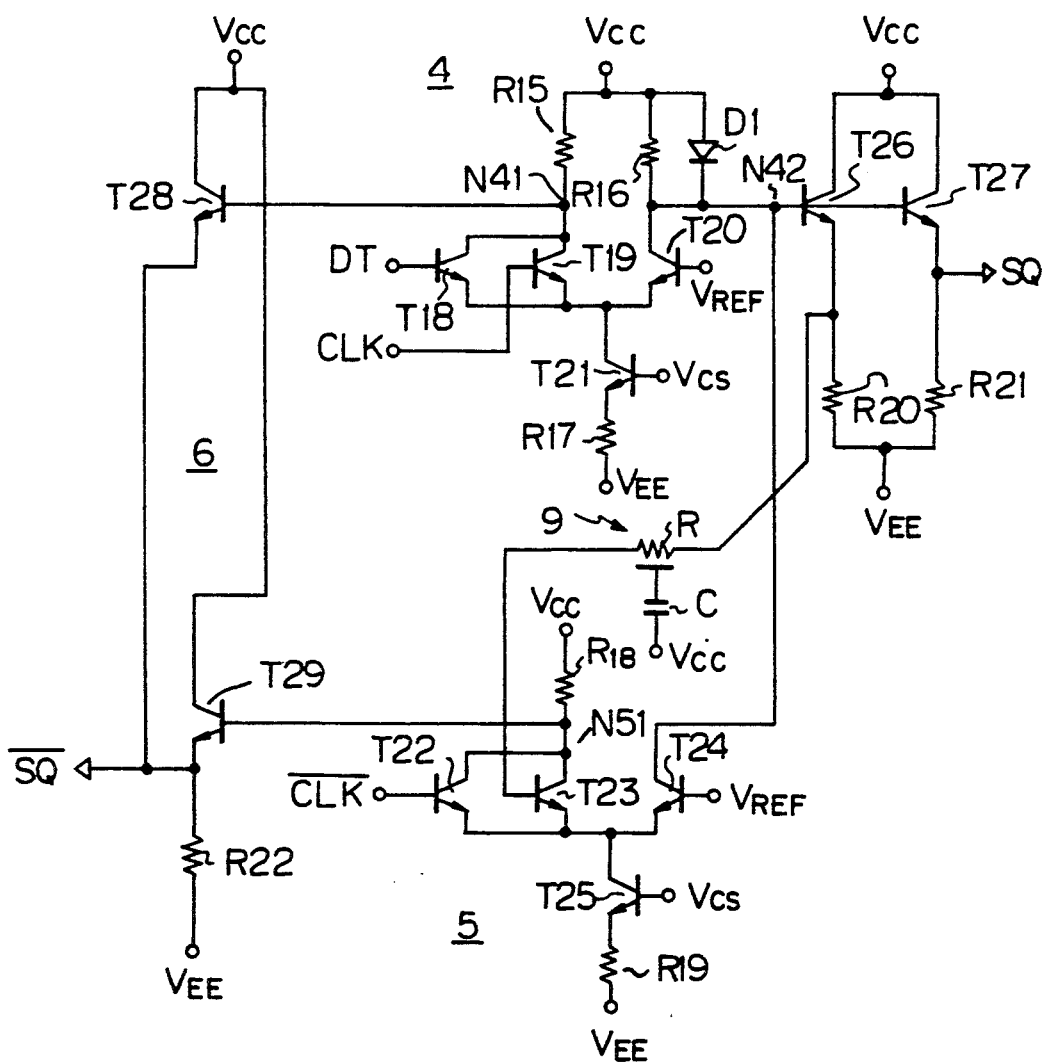
FIG. 10 is a circuit diagram of the latch circuit shown in FIG. 9.

The latch circuit shown in FIG. 9 can be realized by a circuit shown in FIG. 10, as an example of an ECL gate circuit. In FIG. 10, the OR gate circuit 4 includes transistors T18, T19, T20, and T21, a diode D1, and resistors R15, R16, and R17. The OR gate circuit 5 includes transistors T22, T23, T24, and T25 and resistors R18 and R19. At a node N42, a collector of the transistor T20 and a collector of the transistor T24 are commonly connected to form the wired-AND gate circuit 7. The AND gate circuit 7 includes two emitter follower circuits, consisting respectively of transistors T26, T27 and resistors R20 and R21. One of these is used for outputting the signal SQ without affecting the LPF circuit 9, and the other is used to feed back the signal to a base of the transistor T23. The LPF circuit 9 is provided in the feedback line to prevent a delay of the circuit response, as set forth above. The OR gate circuit 6 includes transistors T28 and T29 and a resistor R22 and outputs the output signal $\overline{SQ}$. The input data DT is supplied to a base of the transistor T18. The clock pulse $\overline{CLK}$ is supplied to a base of the transistor T19. The inverted clock pulse $\overline{CLK}$ is supplied to a base of the transistor T22.

The circuit parameters in FIG. 10 are applied in the same way as in FIG. 6, as mentioned above. In FIG. 10, if a noise pulse due to alpha rays is supplied to a node N42 under the latch circuit holding the output SQ at a high level, the noise pulse through the transistor T6 is eliminated at the LPF circuit 9, and thus is not transmitted to the OR gate circuit 5.

Figure 11:
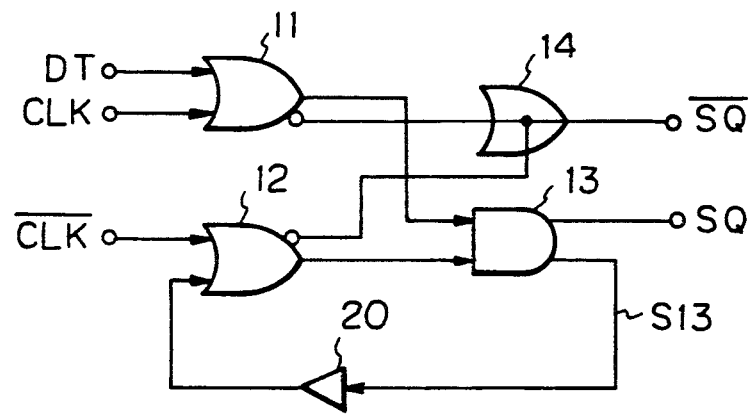
FIG. 11 is a block diagram of a latch circuit of still another embodiment according to the present invention.

Referring to FIG. 11, still another embodiment of the present invention will be described. A latch circuit includes an OR gate circuit 11 receiving an input data DT and a clock signal CLK and having an inverted output terminal and a non-inverted terminal, an $\overline{OR}$ gate circuit 12 receiving an inverted clock signal $\overline{CLK}$ and having an inverted output terminal, an AND gate circuit 13 outputting a non-inverted output signal SQ, and a wired-OR gate circuit 14 outputting an inverted output signal $\overline{SQ}$. The non-inverted output terminals of the OR gate circuits 11 and 12 are connected to the input terminals of the AND gate circuit 13. The inverted output terminals of the OR gate circuits 11 and 12 are connected to the wired-OR gate circuit 14. An amplifier circuit 20 is provided in a feedback line from the output terminal of the AND gate circuit 13 to an input terminal of the OR gate circuit 12. The amplifier circuit 20 delays an input signal by a predetermined period defined by a gate element therein and amplifies the input signal to a predetermined level.

The latch circuit shown in FIG. 11 is similar to that shown in FIG. 9, except for the provision of the LPF circuit 9 in FIG. 9 and the amplifier circuit 20 in FIG. 11. The basic operation of the latch circuit in FIG. 11 is thus similar to that of the latch circuit shown in FIG. 9.

When a noise pulse due to alpha rays is applied to the latch circuit, the noise pulse is delayed at the gate element in the amplifier circuit 20 and an output signal S13 having the noise pulse superimposed is also amplified in the amplifier circuit 20. A noise pulse having a very short pulse width may be suppressed at the gate element. Another noise pulse having a wider pulse width is amplified to a predetermined level higher than a threshold level of the gate trigger of the OR gate circuit 12.

Figure 12:
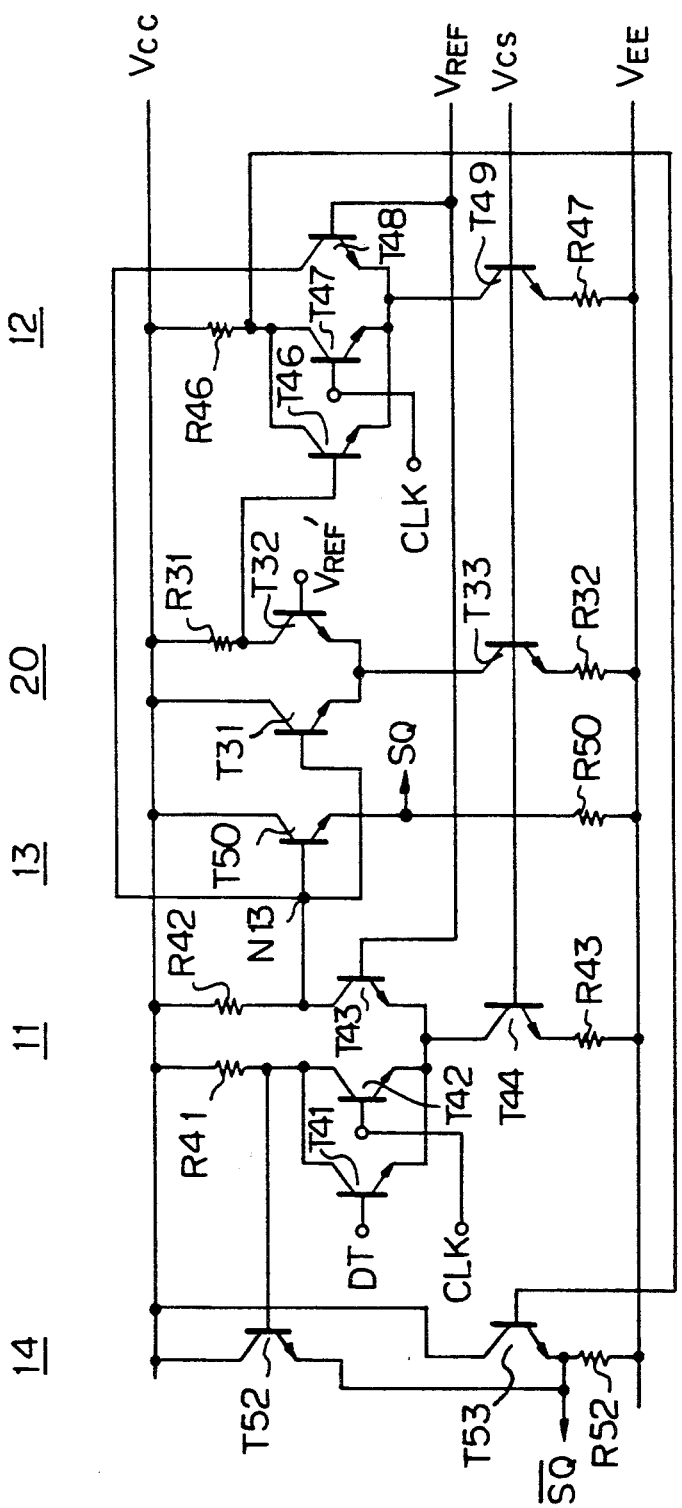
FIG. 12 is a circuit diagram of the latch circuit shown in FIG. 11.

Referring to FIG. 12, the latch circuit in FIG. 11 will be specifically described. In FIG. 12, the OR gate circuit 11 includes gate transistors T41 to T43, resistors R41 and R42, and a current source of a transistor T44 and a resistor R43. The OR gate circuit 12 includes gate transistors T46 to T48, a resistor R46 and a current source of a transistor T49 and a resistor R47. A collector of the transistor T43 and a collector of the transistor T48 are commonly connected at a node N13 to form the wired-AND gate circuit 13. The wired-AND gate circuit 13 includes an emitter follower circuit of a transistor T50 and a resistor R50, for outputting the non-inverted output signal SQ. The OR gate circuit 14 includes parallel-connected transistors T52 and T53 and a resistor R52, and outputs the inverted output signal $\overline{SQ}$. The amplifier circuit 20 includes a differential amplifier consisting of transistors T31 and T32 and a resistor R31 and a current source consisting of a transistor T33 and a resistor R32.

The input data DT is supplied to a base of the transistor T41. The clock pulse $\overline{CLK}$ is supplied to a base of the transistor T42. The inverted clock pulse CLK is supplied to a base of the transistor T47. A base of the transistor T31 is connected to the node N13. A collector of the transistor T32 is connected to a base of the transistor T46.

When a negative polarity of a noise pulse due to alpha rays appears at the collector of the transistor T43, the noise pulse is supplied to the base of the transistor T31. If the noise pulse has a very short pulse width, it may be reduced by the transistors T31 and T32 having gate delay characteristics, but a noise pulse having a wide pulse width is not eliminated by the transistors T31 and T32. The signal including the noise pulse applied to the amplifier is amplified over a threshold level of the transistor T46. Accordingly, the transistor T46 is not turned OFF even for a short period, maintaining the held state.

An amplification factor of the amplifier is adjusted by changing resistance of the resistor R31. The output level of the collector of the transistor T32 may be set approximately as two times that of the input data DT or other signals.

An example of circuit parameters in the latch circuit shown in FIG. 11 is as follows:

| | |
|---|---|
| Resistance of the resistors R41, R42, and R46: | 2.5 kΩ |
| Resistance of the resistors R43 and R47: | 0.75 kΩ |
| Resistance of the resistors R50 and R52: | 1 kΩ |
| Resistance of the resistor R31: | 5 kΩ |
| Resistance of the resistor R32: | 0.75 kΩ |
| Voltage of $V_{REF'}$: | −1.1 V |

Figure 13:
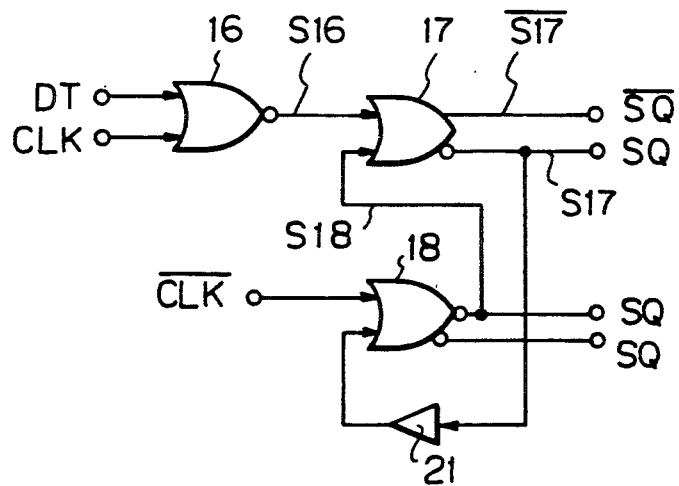
FIG. 13 is a block diagram of a latch circuit of yet another embodiment according to the present invention; and, FIG. 14 is a circuit diagram of the latch circuit shown in FIG. 13.

Referring to FIG. 13, yet another embodiment of the present invention will be described. The latch circuit in FIG. 13 is the same type of latch circuit as shown in FIGS. 1 and 5. The latch circuit includes a NOR gate circuit 16 receiving an input data DT and a clock signal CLK, a NOR gate circuit 17, and a NOR gate circuit 18 receiving an inverted clock signal $\overline{CLK}$. An amplifier circuit 21 is provided in a feedback line between an output of the NOR gate circuit 17 and an input of the NOR gate circuit 18. The NOR gate circuit 17 may be replaced by an OR gate circuit having inverted output and non-inverted output terminals.

Figure 14:
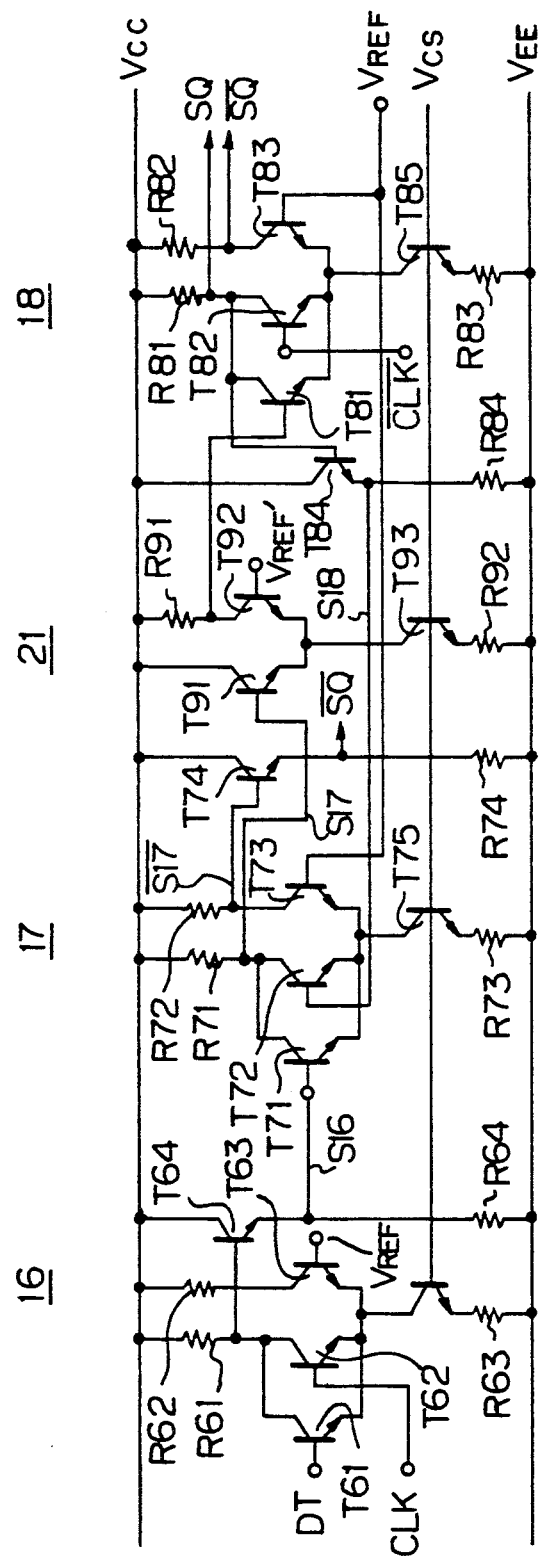

FIG. 14 is a circuit diagram of the latch circuit shown in FIG. 13. In FIG. 14, the NOR gate circuits 16 to 18 are similar to the detailed circuits shown in FIG. 6. However, in order to simplify the drawing, one emitter follow circuit in each of the NOR gate circuits 17 and 18 is omitted from the drawing. The amplifier circuit 21 is similar to the circuit configuration shown in FIG. 12.

The latch circuits having noise resistance circuits, i.e., the LPF circuits 8 and 9 and/or the amplifier circuits 20 and 21, may have a resistance against normal external noises, such as high-frequency noises, noises from power sources, etc.

The latch circuits of the present invention can be applied not only to other bipolar-type integrated circuits, for example, TTL circuits, but also to metal-insulation-semiconductor (MIS) integrated circuits, for example, static and dynamic RAMs, and other semiconductor devices.

The latch circuits of the present invention may be used in a variety of applications, such as gate array devices, memory devices, etc. The latch circuits of the present invention can be also applied not only to a semiconductor device, but also to other logic circuits.

Many widely different embodiments of the present invention may be constructed without departing from the spirit and scope of the present invention. It should be understood that the present invention is not limited to the specific embodiments described in this specification, except as defined in the appended claims.

We claim:

1. A latch circuit comprising:
   a first gate circuit having input terminals for receiving a data signal and a clock signal, and having an output terminal providing the data signal in response to the clock signal;
   a second gate circuit having a first input terminal operatively connected to the output terminal of said first gate circuit for receiving the data signal, having a second input terminal and having an output terminal;
   a third gate circuit having a first input terminal operatively connected to receive an inverted clock signal, having a second input terminal and having first and second output terminals;
   a first feedback line connected between the output terminal of said second gate circuit and the second input terminal of said third gate circuit;
   a second feedback line connected between the first output terminal of said third gate circuit and the second input terminal of said second gate circuit, the second output terminal of said third gate circuit and the output germinal of said second gate circuit outputting complementary signals in response to a latched state of said latch circuit; and
   noise resistance means, operatively connected to only said second feedback line including at least a signal delay element, for eliminating noise in said second feedback line and maintaining operation speed of said latch circuit.

2. A latch circuit according to claim 1, wherein said noise resistance circuit further includes a filter circuit.

3. A latch circuit according to claim 2, wherein said first, second and third gate circuits are NOR gate circuits.

4. A latch circuit according to claim 2 wherein said filter circuit includes:
   a resistor; and
   a capacitor operatively connected in series with said resistor.

5. A latch circuit according to claim 4, wherein said latch circuit is formed in a semiconductor device.

6. A latch circuit according to claim 5, wherein said resistor is formed in a diffused region.

7. A latch circuit according to claim 6, wherein said capacitor is formed in a depletion layer adjacent to said resistor diffused region.

8. A latch circuit according to claim 1, wherein said latch circuit is formed in a semiconductor device.

9. A latch circuit according to claim 8, wherein said semiconductor device is a bipolar-type semiconductor device.

10. A latch circuit according to claim 9, wherein said gate circuits are formed employing emitter-coupled logic.

11. A latch circuit, comprising:

a first OR gate circuit, operatively connected to receive a data signal and a clock signal, and having a noninverted output terminal and an inverted output terminal;

a second OR gate circuit having a first input terminal operatively connected to receive an inverted clock signal and having a second input terminal, a non-inverted output terminal, and an inverted output terminal;

an AND gate circuit having first and second input terminals and having first and second output terminals;

a wired OR gate circuit having first and second input terminals, said non-inverted output terminal of said first OR gate circuit operatively connected to the first input terminal of said AND gate circuit, and said inverted output terminal of said first OR gate circuit operatively connected to the first input terminal of said wired OR gate circuit, said inverted output terminal of said second OR gate circuit operatively connected to the second input terminal of said wired OR gate circuit, and said non-inverted output terminal of said second OR gate circuit operatively connected to the second input terminal of said AND gate circuit, an output terminal of said wired OR gate circuit and the first output terminal of said AND gate circuit outputting complementary signals;

a feedback line connected between the second output terminal of said AND gate circuit and the second input terminal of said second OR gate circuit; and noise resistance means, operatively connected to said feedback line, including at least a signal delay element.

12. A latch circuit comprising:

a first gate circuit for receiving a data signal and a clock signal, and having an output terminal outputting the data signal in response to the clock signal;

a second gate circuit having a first input terminal operatively connected to said output terminal of said first gate circuit and having a second input terminal, and having first and second output terminals;

a third gate circuit having first and second input terminals and having first and second output terminal;

a first feedback line connected between said second output terminal of said second gate circuit and said second input terminal of said third gate circuit;

a second feedback line connected between said first output terminal of said third gate circuit and said second input terminal of said second gate circuit; and noise resistance means, operatively connected to only said first feedback line, including at least a signal delay element.

13. A latch circuit according to claim 12, wherein one of said first and second output terminals of said third gate circuit is a non-inverted output terminal.

14. A latch circuit comprising:

a first gate circuit having input terminals for receiving a data signal and a clock signal, and having an output terminal providing the data signal in response to the clock signal;

a second gate circuit having a first input terminal operatively connected to the output terminal of said first gate circuit for receiving the data signal, having a second input terminal, and having an output terminal;

a third gate circuit having a first input terminal operatively connected to receive an inverted clock signal, having a second input terminal, and having first and second output terminals;

a first feedback line connected between the output terminal of said second gate circuit and the second input terminal of said third gate circuit;

a second feedback line connected between the first output terminal of said third gate circuit and the second input terminal of said second gate circuit, the second output terminal of said third gate circuit and the output terminal of said second gate circuit outputting complementary signals in response to a latched state of said latch circuit; and noise resistance means, operatively connected to only said second feedback line, including at least a signal delay element, for eliminating noise in said second feedback line and maintaining operation speed of said latch circuit, said noise resistance circuit including:

an amplifier circuit including a signal delay element having a predetermined delay time and a signal amplifying element having a predetermined amplification.

15. A latch circuit according to claim 14, wherein said amplifier circuit includes a differential amplifier.

16. A latch circuit according to claim 15, wherein said differential amplifier includes transistors.

* * * * *

UNITED STATES PATENT AND TRADEMARK OFFICE
CERTIFICATE OF CORRECTION

PATENT NO. : 5,144,158
DATED : SEPTEMBER 1, 1992
INVENTOR(S) : YASUNORI KANAI ET AL.

It is certified that error appears in the above-identified patent and that said Letters Patent is hereby corrected as shown below:

TITLE PAGE, [63], line 1, "Sep. 28, 1989," should be --Sep. 26, 1989,--;
    [57], line 9, "is" (first occurrence) should be deleted.

Col. 1, line 18, "terminal. A second input terminal of the third gate cir-" should be --circuits in a semiconductor device,--;
    line 19, "cuit" should be deleted;
    line 30, "in area" should be --in the area--.

Col. 4, line 45, "thoriam," should be --thorium--;
    line 48, "of a pair" should be deleted;
    line 52, "pair" should be deleted;
    line 63, "parasite" should be --parasitic--.

Col. 6, line 13, "mA. a" should be --mA. A--.

Col. 10, line 34, "germinal" should be --terminal--;
    line 48, "2" should be --2,--.

Col. 11, line 46, "terminal;" should be --terminals;--.

UNITED STATES PATENT AND TRADEMARK OFFICE
CERTIFICATE OF CORRECTION

PATENT NO.  : 5,144,158
DATED       : SEPTEMBER 1, 1992
INVENTOR(S) : YASUNORI KANAI ET AL.

It is certified that error appears in the above-identified patent and that said Letters Patent is hereby corrected as shown below:

Col. 11, line 46, "terminal;" should be --terminals;--.

Signed and Sealed this

Twenty-first Day of September, 1993

Attest:

BRUCE LEHMAN

*Attesting Officer*       *Commissioner of Patents and Trademarks*